US012149265B2

(12) United States Patent
Massimino et al.

(10) Patent No.: US 12,149,265 B2
(45) Date of Patent: Nov. 19, 2024

(54) EFFICIENT UPDATE OF CUMULATIVE DISTRIBUTION FUNCTIONS FOR IMAGE COMPRESSION

(71) Applicant: GOOGLE LLC, Mountain View, CA (US)

(72) Inventors: Pascal Massimino, Orsay (FR); Vincent Rabaud, Paris (FR)

(73) Assignee: GOOGLE LLC, Mountain View, CA (US)

( * ) Notice: Subject to any disclaimer, the term of this patent is extended or adjusted under 35 U.S.C. 154(b) by 183 days.

(21) Appl. No.: 17/904,030

(22) PCT Filed: Jul. 6, 2020

(86) PCT No.: PCT/US2020/070236
§ 371 (c)(1),
(2) Date: Aug. 11, 2022

(87) PCT Pub. No.: WO2022/010531
PCT Pub. Date: Jan. 13, 2022

(65) Prior Publication Data
US 2023/0085142 A1 Mar. 16, 2023

(51) Int. Cl.
*H03M 7/30* (2006.01)
*H03M 7/40* (2006.01)
*H04N 19/91* (2014.01)

(52) U.S. Cl.
CPC ....... *H03M 7/3071* (2013.01); *H03M 7/4006* (2013.01); *H04N 19/91* (2014.11)

(58) Field of Classification Search
CPC ... H03M 7/3071; H03M 7/4006; H04N 19/91
(Continued)

(56) References Cited

U.S. PATENT DOCUMENTS 5,650,783 A * 7/1997 Murashita ............... G06T 9/005
341/107

OTHER PUBLICATIONS

International Search Report and Written Opinion for PCT Application No. PCT/US2020/070236, mailed on Apr. 9, 2021, 11 pages.
(Continued)

*Primary Examiner* — Khai M Nguyen
(74) *Attorney, Agent, or Firm* — Brake Hughes Bellermann LLP (57) ABSTRACT

Updating cumulative distribution functions (CDFs) during arithmetic encoding can be a challenge because the final element of the CDF should remain fixed during the update calculations. If the probabilities were floating-point numbers, this would not be too much of a challenge; nevertheless, the probabilities and hence the CDFs are represented as integers to take advantage of infinite-precision arithmetic. Some of these difficulties may be alleviated by introducing a "mixing" CDF along with the active CDF being updated; the mixing CDF provides nonlocal context for updating the CDF due to the introduction of a particular symbol in the encoding. Improved techniques of performing arithmetic encoding include updating the CDF using two, one-dimensional mixing CDF arrays: a symbol-dependent array and a symbol-dependent array. The symbol-dependent array is a sub array of a larger, fixed array such that the sub array selected depends on the symbol being used.

21 Claims, 3 Drawing Sheets

(58) Field of Classification Search
USPC .......................................... 341/65, 67, 107
See application file for complete search history.

(56) References Cited

OTHER PUBLICATIONS

Fenwick, "A New Data Structure for Cumulative Frequency Tables", Software-Practice and Experience, Wiley & Sons, Bognor Regis, GB; vol. 24, No. 3, Mar. 1, 1994, pp. 327-336.
Moffat, "An Improved Data Structure for Cumulative Probability Tables", Software-Practice and Experience, Wiley & Sons, Bognor Regis, GB; vol. 29, No. 7, Jun. 1, 1999, pp. 647-659.
Said, "Introduction To Arithmetic Coding—Theory and Practice", Hewlett Packard Laboratories Report, Apr. 21, 2004, 67 pages.
Yue, et al., "An Overview of Core Coding Tools in the AV1 Video Codec", Picture Coding Symposium (PCS); IEEE, Jun. 24, 2018, pp. 41-45.

* cited by examiner

EFFICIENT UPDATE OF CUMULATIVE DISTRIBUTION FUNCTIONS FOR IMAGE COMPRESSION

CROSS REFERENCE TO RELATED APPLICATION

This application is a 35 U.S.C. § 371 National Phase Entry Application from PCT/US2020/070236, filed Jul. 6, 2020, designating the U.S., the disclosure of which is incorporated herein by reference in its entirety.

TECHNICAL FIELD

This description relates to image compression and, in particular, the efficient updating of cumulative distribution functions for image compression.

BACKGROUND

Compression of color images is performed to reduce the size of files storing images and can be performed, in some implementations, by eliminating redundant information within an image. For example, after transforming color channels from one basis (e.g., RGB) to a luminance-chrominance basis (e.g., YUV coordinates), the values in the transformed color channels can be subtracted from a model of the color value correlation between neighboring pixels to produce residual values in each color channel. These residual values then can be transformed into a frequency-space representation (e.g., discrete cosine transform (DCT), discrete wavelet transform (DVT)) so that high-frequency residual values that have less impact on the image may be eliminated and the size of the image can be reduced accordingly. These transformed residuals then can be quantized to a certain number of bits, and these quantized residuals can be encoded according to an encoding scheme such as entropy encoding.

SUMMARY

Implementations provide an image compression scheme that uses a highly efficient and robust encoder. The encoder replaces with codewords an alphabet of symbols, each symbol having a probability of being used according to a probability model. The model assigning probability values to the symbols of the alphabet is adaptive so that each time a symbol is observed, the cumulative distribution function (CDF) (i.e., the sum of the probabilities of a specified subsequence of symbols) of the symbols of the alphabet is updated. A robust updating procedure includes generating a change to the CDF based on a precomputed mixing CDF, wherein the mixing CDF includes a respective, separate mixing model corresponding to each symbol of the alphabet. The mixing CDF in this case is then a two-dimensional array of mixing CDF values. While robust, this updating procedure is not very efficient, as the two-dimensional array uses many computing resources in storing and accessing the mixing CDF data. An improved implementation replaces the two-dimensional mixing CDF array with two, one-dimensional arrays: a symbol-independent mixing CDF array and a symbol-dependent mixing CDF array. The symbol-dependent mixing array is sampled from a larger, fixed array. Because the CDF updating step occupies, on average, about 40% of the encoding computational resources, the efficiency gained in using the two mixing CDF arrays is significant.

In one general aspect, a method can include receiving raw data (such as data obtained based on an image) for encoding, the raw data represented by an alphabet of symbols. The method can also include initializing a cumulative distribution function (CDF) array representing a CDF evaluated at a plurality of indices. The indices may have a predetermined order, e.g. they may be respective different numerical values (e.g. consecutive integers, such as 0 to N) such that the order of the indices is the order of the numerical values, with lower numerical values being earlier in the order. Here we use the terminology that one index is "less" than or "more than" another to mean that the first index is respectively earlier or later in the order than the second index; we also refer to a certain index being less than or more than a "threshold index", which respectively means before or after the threshold index in the order. Each of the plurality of indices representing a symbol of an alphabet representing a portion of the raw data, the CDF at an index of the plurality of indices representing a cumulative sum of probabilities of symbols of the alphabet represented by indices of the plurality of indices less than or equal to the index. The method can further include, in response to receiving a first symbol of the alphabet representing a first portion of the raw data, updating the CDF array based on a first mixing CDF array and a second mixing CDF array to produce an updated CDF array, the first mixing CDF array having values that are independent of the first symbol, the second mixing CDF array having values based on the symbol, the updated CDF array being used to determine a probability of a second symbol of the alphabet representing a second portion of the raw data. The method can further include encoding the first symbol and the second symbol using the updated CDF array to produce a codeword, the codeword, when decoded, reproducing the first and second portions of the raw data. This reproduction may not be exact; instead, it may produce data which differs from the first and second portions of the raw data by an amount which satisfies a smallness criterion. For example, the proportion of symbols which are not correctly reproduced may be below a threshold.

In another general aspect, a computer program product comprises a non-transitory storage medium, the computer program product including code that, when executed by processing circuitry of a computing device, causes the processing circuitry to perform a method. The method can include receiving raw data for encoding, the raw data represented by an alphabet of symbols. The method can also include initializing a cumulative distribution function (CDF) array representing a CDF evaluated at a plurality of indices, each of the plurality of indices representing a symbol of an alphabet representing a portion of the raw data, the CDF at an index of the plurality of indices representing a cumulative sum of probabilities of symbols of the alphabet represented by indices of the plurality of indices less than or equal to the index. The method can further include, in response to receiving a first symbol of the alphabet representing a first portion of the raw data, updating the CDF array based on a first mixing CDF array and a second mixing CDF array to produce an updated CDF array, the first mixing CDF array having values that are independent of the first symbol, the second mixing CDF array having values based on the symbol, the updated CDF array being used to determine a probability of a second symbol of the alphabet representing a second portion of the raw data. The method can further include encoding the first symbol and the second symbol using the updated CDF array to produce a codeword, the codeword, when decoded, reproducing the first and second portions of the raw data.

In another general aspect, an electronic apparatus configured to generate a recrawling policy comprises memory and controlling circuitry coupled to the memory. The controlling circuitry can be configured to receive raw data for encoding, the raw data represented by an alphabet of symbols. The controlling circuitry can also be configured to initialize a cumulative distribution function (CDF) array representing a CDF evaluated at a plurality of indices, each of the plurality of indices representing a symbol of an alphabet representing a portion of the raw data, the CDF at an index of the plurality of indices representing a cumulative sum of probabilities of symbols of the alphabet represented by indices of the plurality of indices less than or equal to the index. The controlling circuitry can also be configured to, in response to receiving a first symbol of the alphabet representing a first portion of the raw data, update the CDF array based on a first mixing CDF array and a second mixing CDF array to produce an updated CDF array, the first mixing CDF array having values that are independent of the first symbol, the second mixing CDF array having values based on the symbol, the updated CDF array being used to determine a probability of a second symbol of the alphabet representing a second portion of the raw data. The controlling circuitry can also be configured to encode the first symbol and the second symbol using the updated CDF array to produce a codeword, the codeword, when decoded, reproducing the first and second portions of the raw data.

The details of one or more implementations are set forth in the accompanying drawings and the description below. Other features will be apparent from the description and drawings, and from the claims.

DETAILED DESCRIPTION

The image compression techniques described herein apply to images that may be encoded using arithmetic encoding techniques. Such images generally include most photographs and images exchanged over a network (e.g., the Internet). Arithmetic encoding is but one technique used on a representation of the image data that has been reduced to improve the compression ratio. As discussed herein, there are several steps needed to reduce the original image data to the quantized residual data encoded using an arithmetic encoder. While other encoding techniques may be applied to the quantized residual data, arithmetic encoding in most cases provides a better improvement to compression ratio over other encoding (e.g., Huffman encoding) techniques.

In the images that will benefit most from the techniques described herein, the values of the color channels at a pixel in such an image are well-correlated with the values of the color channels in neighboring pixels. Well-correlated means there is a predictive model that provides an accurate estimate of the color values of a pixel given the color values of neighboring pixels. Of course, such estimates will not provide an exact prediction in any image. Nevertheless, when a good predictive model is applied to an image, the resulting residuals—the differences between the actual color values at a pixel and those values resulting from the predictive model—will no longer be correlated well. Such poorly correlated residual data can be more efficiently coded than the raw image data.

Once the residual data has been generated, the next step is to express this residual data in a way that more naturally provides the ability to filter out data that would likely not be perceived by human observers. For example, data associated with high spatial frequencies most likely will have very small brightness values. In this case, a transform such as a discrete cosine transform (DCT) or a discrete wavelet transform (DVT) is used to identify the high-frequency content of residual data. After such a transform is applied to the residual data, a low-pass filter may be used to reduce the data size by eliminating the data associated with the highest frequencies.

Finally, to prepare for the use of arithmetic encoding (or another entropy encoding technique), the transformed residual data is quantized so that the resulting quantized residual data is represented by a finite number of values. While resulting in a lossy compression, quantizing the transformed residual data has the advantage of significantly improving the compression ratio. Because the quantized residual data is represented by a finite number of values, an encoder may represent the quantized residual data in terms of symbols of a finite alphabet used in a codebook.

In arithmetic encoding, there exists an alphabet of N symbols that is used to encode quantized residuals, where in some encoders N is based on the number of bits used in the quantization. (Some encoders use N=16 symbols.) Some of the symbols of the alphabet are more likely to occur than other symbols, i.e. some symbols have a higher probability of occurring than others. The probabilities of each symbol of the alphabet occurring may be determined from historical behavior or a model.

In an example implementation of an arithmetic encoder, the encoder represents a probability of each symbol of an alphabet appearing in the raw data (i.e., the quantized residual data) as follows. Imagine an interval [0,1) on a number line. The interval represents all symbols of the alphabet appearing in the raw data as that interval. Each symbol of the alphabet is assigned a subinterval of that interval, just as each symbol is a part of the alphabet. For example, consider an alphabet containing three symbols: a, b, and c. Suppose that the symbol a has a probability of appearing in the raw data of 0.4, the symbol b has a probability of 0.5, and the symbol c has a probability of 0.1. Then, upon encoding a quantized residual, the interval is subdivided into a subinterval [0,0.4) for a, a subinterval [0.4,0.9) for b, and [0.9,1.0) for c. If the first symbol observed in a bitstream containing the raw data during encoding is b, then the subinterval selected is [0.4,0.9), as that subinterval represents the symbol b. When the arithmetic encoding scheme is not adaptive and upon observation of the next symbol in the bitstream of raw data, that subinterval is subdivided again in proportions according to the probabilities of the symbols, i.e., into a subinterval [0.4,0.6) for a (i.e., 40% of the subinterval), a subinterval [0.6,0.85) for b (i.e., 50% of the subinterval), and [0.85,0.9) for c (i.e., 10% of the subinterval). This process continues until the final subinterval size is less than or equal to the product of the probabilities of the symbols used in decoding the quantized residuals. In this case, as each symbol has two bits, then for an encoding having M symbols, then the first 2M bits of a subinterval endpoint will uniquely identify the quantized residual upon decoding. For example, when the symbols in a data stream are "bbbc," the final interval has a length of 0.0125, which is equal to $(0.5)^3(0.1)$. The encoded data in this case may take the form of a binary representation without decimals, or 110100. This encoder has reduced the raw data from 8 bits to 6.

In general, when the $k^{th}$ symbol $a_k$ of an alphabet has a probability of $p_k$, and a previous subinterval has endpoints [L, H), then the updated subinterval corresponding to symbol $a_i$ is [L+$P_C$(H−L), L+$P_N$(H−L)), where $P_C$=$p_1$+$p_2$+ . . . +$p_{i-1}$ and $P_N$=$P_C$+$p_i$ represent cumulative probabilities. Accordingly, the cumulative probabilities, or cumulative distribution functions (CDFs), are used in determining an arithmetic encoding.

Some arithmetic encoders are adaptive in that they update the symbol probabilities, and hence the respective CDFs, as a symbol is used in an encoding. In many scenarios, it is preferable to update CDFs rather than the probabilities directly because CDFs are easier to work with using integer arithmetic. Conventional approaches to updating CDFs in an arithmetic encoder include increasing the CDF at an index corresponding to a symbol, and at indices larger than the symbol.

It is noted that a CDF is represented as an array of numerical values, each representing a cumulative probability corresponding to a symbol in an alphabet. As probabilities are positive numbers, a CDF should satisfy the relation CDF[k]≥CDF[k−1] for all values of the indices k corresponding to each symbol of the alphabet. Moreover, the first and last elements of the CDF array should satisfy CDF[0]=0 and CDF[N]=PMAX, where PMAX is a fixed number representing the sum of all of the probabilities and the maximum value of the CDF; these two values are fixed during the updating.

A technical problem with the above-described conventional approaches to updating CDFs in an arithmetic encoder is that such conventional approaches cause practical difficulties upon implementation for non-binary alphabets. For example, updating the CDFs can be a challenge because the final element of the CDF should remain fixed during the update calculations. If the probabilities were floating-point numbers, this would not be much of a challenge. However, the symbol probabilities, and hence the CDFs, are represented as integers to take advantage of infinite-precision arithmetic.

To see the problems inherent in integer arithmetic, consider the addition of two, 3-symbol, integer probability arrays: p=(3 3 2) and q=(1 6 2) such that the sum of the elements is constant at 8. The average of these two arrays is z (p+q)=(2 4.5 1.5), which is no longer an integer array. To make an integer array, we either round both fractions up or down; doing so fails to maintain the constraint of keeping the sum of the elements at 8. This is a difficulty in maintaining the last element of the CDF array at the PMAX value.

Some of these difficulties may be alleviated by introducing a "mixing" CDF along with the active CDF being updated, where the mixing CDF provides nonlocal context for updating the CDF due to the introduction of a particular symbol in the encoding. Nevertheless, such mixing CDFs, which take the form of a two-dimensional matrix representing a fixed model for each symbol, can use a great deal of CPU and memory resources when such resources may be scarce.

In accordance with the implementations described herein, a technical solution to the above-described technical problem includes updating the CDF using two, one-dimensional mixing CDF arrays: a symbol-dependent array and a symbol-independent array. The symbol-dependent array may be a subarray of a larger, fixed array such that the subarray selected depends on the symbol being used.

A technical advantage of disclosed implementations is that the above-described encoder uses far fewer resources and is accordingly more efficient than an encoder operating according to the conventional approaches.

Figure 1:
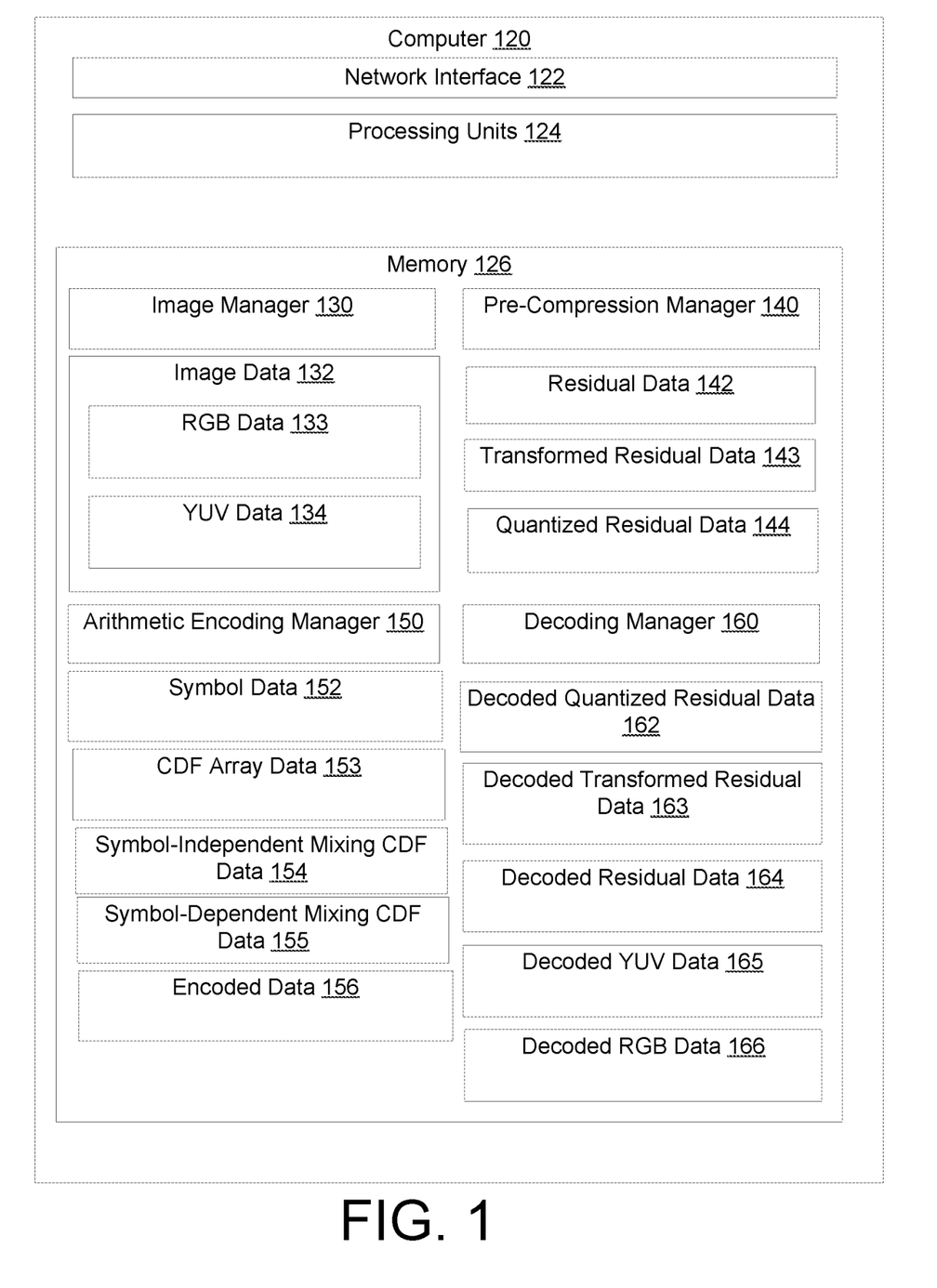
FIG. 1 is a diagram that illustrates an example electronic environment in which improved techniques described herein may be implemented.

FIG. 1 is a diagram that illustrates an example electronic environment 100 in which the above-described technical solution may be implemented. The electronic environment 100 includes a computer 120 configured to perform image compression and decompression.

The computer 120 includes a network interface 122, one or more processing units 124, memory 126, and a display interface 128. The network interface 122 includes, for example, Ethernet adaptors, Token Ring adaptors, and the like, for converting electronic and/or optical signals received from a communication network to electronic form for use by the computer 120. The set of processing units 124 include one or more processing chips and/or assemblies. The memory 126 includes both volatile memory (e.g., RAM) and non-volatile memory, such as one or more ROMs, disk drives, solid state drives, and the like. The set of processing units 124 and the memory 126 together form control circuitry, which is configured and arranged to carry out various methods and functions as described herein.

In some implementations, one or more of the components of the computer 120 can be, or can include processors (e.g., processing units 124) configured to process instructions stored in the memory 126. Examples of such instructions as depicted in FIG. 1 include an image manager 130, a pre-compression manager 140, an arithmetic coding manager 150, and a decoding manager 160 (note that in some variants the computer system may include only an arithmetic coding manager 150 for generating codes for decoding by another computer, or only an decoding manager 160 for generating codes encoded by another computer). Further, as illustrated in FIG. 1, the memory 126 is configured to store various data, which is described with respect to the respective managers that use such data.

The image manager 130 is configured to receive or acquire image data 132. In some implementations, the image manager 130 is configured to receive or acquire the image data 132 over the network interface 122, i.e., over a network (such as network 190) from the display device 170. In some implementations, the image manager 130 is configured to receive or acquire the image data 132 from local storage (e.g., a disk drive, flash drive, SSD, or the like).

The image data 132 represents a color image. The image data 132 includes a set of pixels, each of the set of pixels having a coordinate within the image and a set of numerical values, each of the set of numerical values representing a value within a color channel. In some implementations, the color channels used in the image data 132 are RBG, e.g., RGB data 133.

In some implementations, the image manager 130 is also configured to convert the image data 132 from one set of color channels (e.g., RGB data 133) to another set of color channels (e.g., YUV data 134). In converting the color channels from RGB to YUV, the encoder may operate directly on a luminance channel, because compression of such luminance data in the YUV channels generally is more efficient than compression of the color data in the RGB channels.

A pre-compression manager 140 is configured to generate raw data for use by the arithmetic coding manager 150 for encoding. In some implementations, the raw data is not the YUV image data 134 itself but rather a derived form of that data configured for an efficient entropy encoding. Such implementations rely on the high amount of correlation between values of the color channels in a small neighborhood surrounding a pixel. The pre-compression manager 140 is then configured to apply a predictive model representing the correlation and generate residuals, i.e., a difference between the given image values in the YUV data 134 and the values according to the predictive model. Such residual data has a lower entropy than the actual image data due to the reduction in correlation between the residual values.

The residual data 142 represents the residual values as described above. When derived from the YUV data 134, the residual data 142 includes triplets of real values indicating a distribution of deviations from a predictive model as a function of spatial coordinate within the image. The predictive model is derived based on the YUV data 134, such as by known methods.

The pre-compression manager 140 is also configured to, in some implementations, perform a transformation of the residual data 142 in image coordinate space into transformed residual data 143 in image frequency space. In some implementations, the transformation is a Fourier transform. In some implementations, the transformation is a discrete cosine transform (DCT). In some implementations, the transformation is a discrete wavelet transform (DVT).

The pre-compression manager 140 is also configured to, in some implementations, perform a quantization of the transformed residual data 143 to produce quantized residual data 144. The quantized residual data 144 allows the encoder to achieve higher compression ratios at the expense of reducing the information content in the image. When the transformed residual data is generated using a DCT, such as by using an 8×8 DCT matrix, the quantization is performed using a fixed quantization matrix (such as a fixed 8×8 quantization matrix) for the luminance and chrominance components of the YUV data 134. The quantization matrix generally reduces or eliminates residual values corresponding to high frequencies.

The arithmetic encoding manager 150 is configured to perform an arithmetic coding of the quantized residual data 144 to produce encoded data 156. The arithmetic coding manager replaces symbols (representing the quantized residual data 144 in this case) from an alphabet of symbols represented by symbol data 152 with numerical values that use less memory space than the symbols.

The symbol data 152 represents an alphabet or set of symbols that encompass the possible elemental representations of the quantized residual data 144. Because the residual data has been quantized, that data 144 only takes on a finite number of values. Each of those values may be represented by a symbol of the alphabet. Moreover, each symbol has a probability of occurring. The probability may be based on historical data or on a more theoretical understanding of the occurrence of symbols in quantized residual data 144. It is noted that the alphabet—and hence, the CDF—may apply to not only the quantized residual data 144 but to any syntactic element in the bitstream (e.g., block-type, transform type, predictor type, etc.).

The CDF array data 153 represents a CDF array, or CDF of the symbols of the alphabet. That is, a difference between two consecutive entries of the CDF array produces a probability of a symbol, i.e., if the CDF array is represented as CDF[k] with k representing an index of the $k^{th}$ symbol of the alphabet, the probability of the $k^{th}$ symbol maybe written as $p_k$=(CDF[k+1]−CDF[k])/PMAX, where PMAX=CDF[N] and N is the number of symbols in the alphabet. The CDF array satisfies the following properties:

CDF[0]=0. (The probability of a symbol outside of the alphabet occurring is zero. This holds after updating.)

CDF[N]=PMAX. This holds after updating.

CDF[k]≥CDF[k−1] when k>0. That is, no probability is negative.

In some implementations, N=16; that is, there are 16 symbols in the alphabet used in the arithmetic encoding manager 150.

On at least some occasions when a symbol having index k is observed in a bitstream of raw data (e.g., quantized residual data 144), the arithmetic encoding manager 150 is configured to update the CDF array data 153 to reflect the fact that the symbol having index k is occurring more frequently. This update may be done on all occasions that a symbol is received, or only in some of these cases, e.g. when a certain number of symbols have been received since the last update was done. The difficulty with the updating is that the updating operations are performed using integer arithmetic. Accordingly, maintaining the three properties of the CDF array (denoted CDF) during an updating operation described above is not trivial. Moreover, other constraints may be considered as follows:

A symbol in an alphabet that is never seen, i.e., that has a probability equal to zero, maintains a probability of zero after an update in which that symbol is not observed.

Conversely, symbols that have been seen maintain a non-zero probability after updating.

Nevertheless, an update performed by the arithmetic encoding manager 150, in some implementations, uses a speed value (a positive real number) that is indicative of a number of steps taken for a symbol to increase its probability if that symbol were the only symbol encoded in the bitstream.

Some updating procedures include using a predefined "mixing" CDF representing a particular CDF model. Such a mixing CDF is used to ensure that the properties of the CDF array described above are maintained during an update. For example, one such mixing CDF corresponding to the $k^{th}$ symbol is given by the following expression:

$$CDF_{mixing}[k][i] = \sum_{j=1}^{i}[(1-u)\delta_{kj} + u(1-\delta_{kj})],$$

where $\delta_{kj}$ is the Kronecker symbol (i.e., equal to zero unless k=j), i is an integer between 1 and N, and u is a fixed, empirically chosen parameter. As shown, $CDF_{mixing}[k]$ is the probability one would expect is the symbol corresponding to the index k was repeated dominantly in the bitstream. It is noted that the above mixing CDF is but one example, and other mixing CDFs are possible.

Because the mixing CDF depends on the symbol, there is a separate mixing CDF model for each symbol of the alphabet. Accordingly, as shown above, the mixing CDF is a two-dimensional array requiring N (N+1) entries. In an encoding operation in which the CDF updating occupies about 40% of the processor resources in average, this data structure representing the mixing CDF may use too many resources.

The mixing CDF instead can, in some implementations, be decomposed into two, one-dimensional arrays of: symbol-independent mixing CDF data 154 and symbol-dependent mixing CDF data 155. Such a representation is used as part of the above-described improved techniques and uses fewer computing resources that the conventional two-dimensional array described above. The symbol-independent mixing CDF data 154 represents a symbol-independent mixing CDF array, which is denoted as sym_ind_cdf. The array sym_ind_cdf is a fixed array defined as follows: sym_ind_cdf [k] is equal to the number of symbols having an index less than k having a probability greater than zero. That is, if all symbols in an alphabet are used, then sym_ind_cdf [k]=k.

The symbol-dependent mixing CDF data 155 represents a symbol-dependent mixing CDF array, which is denoted as sym_cdf. The array sym_cdf is a subarray of a fixed, one-dimensional array fix_cdf. The fixed array fix_cdf has 2N+1 elements and may be defined as follows:

$$\text{fix\_cdf}[k] = \begin{cases} 0, & k < N, \\ P_0 - n, & k \geq N, \end{cases}$$

where $P_0$ is a normalized sum of the entries of the CDF array and n is the number of symbols of the alphabet having their probabilities being greater than zero, i.e., the number of symbols used. That is, the fixed array is a step function having N as the threshold index; more generally, the fixed array may represent a sigmoidal function. The symbol-dependent mixing CDF array sym_cdf is then a subarray of fix_cdf as follows: when a symbol having index k is observed, then sym_cdf[i]=fix_cdf [N−1−k+i]. In this way, the symbol dependence of the symbol-dependent mixing CDF array is expressed in the first element of the subarray of the fixed array.

The updating procedure may now be described in the following code. Note that, while the following code is written in the C language, the procedure may be written in any language.

Input: CDF, N, k (the index of the observed symbol), f (a speed value as described above).
Output: An updated CDF.

```
int* sym_cdf=fixed cdf[N−1−k];
for(int i=0; i<N; i++){
    int delta=sym_cdf[i]+sym_ind_cdf[i]−CDF[i];
    CDF[i]+=(int)(delta*f)>>16
}
```

The update to each value of CDF[k] upon receiving the symbol ai is to increase the current value CDF[k] by an amount which is obtained by performing a rounding operation on a product of the speed value (f) and summation term (delta). The summation term is based on the $i^{th}$ element of the symbol-independent mixing CDF array and the $i^{th}$ element of the symbol-dependent mixing CDF array. For example, the summation term may be obtained from the sum of the $i^{th}$ element of the symbol-independent mixing CDF array and the $i^{th}$ element of the symbol-dependent mixing CDF array, minus the current value of CDF[k].

In some implementations, the above procedure may be executed in parallel. Example code implemented using special Intel SSE4.1 instructions are as follows.

```
_m128i A=_mm_loadu_si128((const_m128i*)sym_cdf);
_m128i B=_mm_loadu_si128((const_m128i*) sym_ind_cdf);
_m128i C=_mm_loadu_si128((const_m128i*)CDF);
_m128i D=_mm_add_epi16(A, B);
_m128i E=_mm_sub_epi16(D, C);
_m128i F=_mm_mulhi_epi16(E, f);
_m128i G=_mm_add_epi16(C, F);
mm_storeu_si128(CDF, G);
```

Here, f is a 16-bit-precision representation of the speed f. These instructions are but one example and other instructions may be possible.

After the final symbol in the quantized residual data 144 has been observed, the arithmetic encoding manager 150 completes the encoding of the quantized residual data 144 according to the interval procedure described above, for example, to produce encoded data 156. For an arithmetic encoding, the encoded data 156 takes the form of a floating-point number, although in some implementations the encoded data 156 may take the form of a bit string.

The decoding manager 160 is configured to decode the encoded data 156 to produce decoded quantized residual data 162, i.e., the quantized residual data 144. The decoding manager 160, in performing the decoding operation on the encoded data 156, operates in reverse from the arithmetic encoding manager 150. Moreover, the decoding manager 160 is also configured to produce a lossy version of the original image data 132 in the RGB data format by approximately reversing the operations used by the pre-compression manager 140: dequantizing the quantized residual data 144 to produce decoded transformed residual data 163; it is noted that this dequantization process may not produce the original transformed residual data 143 exactly, but the losses should be as imperceptible as possible. An inverse DCT or DVT, for example, is applied to the decoded transformed residual data 163 to produce decoded residual data 164, i.e., in coordinate space representation. The decoding manager 160 is further configured to add the predictive model values back to the decoded residual data 164 to produce decoded YUV data 164, and finally the decoding manager 160 is further configured to transform the YUV channels back to RGB channels to produce decoded RGB data 166 as the product of the decoding process.

The components (e.g., modules, processing units 124) of the user device 120 can be configured to operate based on one or more platforms (e.g., one or more similar or different platforms) that can include one or more types of hardware, software, firmware, operating systems, runtime libraries, and/or so forth. In some implementations, the components of the computer 120 can be configured to operate within a cluster of devices (e.g., a server farm). In such an implementation, the functionality and processing of the components of the computer 120 can be distributed to several devices of the cluster of devices.

The components of the computer 120 can be, or can include, any type of hardware and/or software configured to process attributes. In some implementations, one or more portions of the components shown in the components of the computer 120 in FIG. 1 can be, or can include, a hardware-based module (e.g., a digital signal processor (DSP), a field programmable gate array (FPGA), a memory), a firmware module, and/or a software-based module (e.g., a module of computer code, a set of computer-readable instructions that can be executed at a computer). For example, in some implementations, one or more portions of the components of the computer 120 can be, or can include, a software module configured for execution by at least one processor (not shown). In some implementations, the functionality of the components can be included in different modules and/or different components than those shown in FIG. 1, including combining functionality illustrated as two components into a single component.

Although not shown, in some implementations, the components of the computer 120 (or portions thereof) can be configured to operate within, for example, a data center (e.g., a cloud computing environment), a computer system, one or more server/host devices, and/or so forth. In some implementations, the components of the computer 120 (or portions thereof) can be configured to operate within a network. Thus, the components of the computer 120 (or portions thereof) can be configured to function within various types of network environments that can include one or more devices and/or one or more server devices. For example, the network can be, or can include, a local area network (LAN), a wide area network (WAN), and/or so forth. The network can be, or can include, a wireless network and/or wireless network implemented using, for example, gateway devices, bridges, switches, and/or so forth. The network can include one or more segments and/or can have portions based on various protocols such as Internet Protocol (IP) and/or a proprietary protocol. The network can include at least a portion of the Internet.

In some implementations, one or more of the components of the computer 120 can be, or can include, processors configured to process instructions stored in a memory. For example, an image manager 130 (and/or a portion thereof), a pre-compression 140 (and/or a portion thereof), an arithmetic coding manager 150 (and/or a portion thereof), and a decoding manager 160 (and/or a portion thereof) can be a combination of a processor and a memory configured to execute instructions related to a process to implement one or more functions.

In some implementations, the memory 126 can be any type of memory such as a random-access memory, a disk drive memory, flash memory, and/or so forth. In some implementations, the memory 126 can be implemented as more than one memory component (e.g., more than one RAM component or disk drive memory) associated with the components of the VR server computer 120. In some implementations, the memory 126 can be a database memory. In some implementations, the memory 126 can be, or can include, a non-local memory. For example, the memory 126 can be, or can include, a memory shared by multiple devices (not shown). In some implementations, the memory 126 can be associated with a server device (not shown) within a network and configured to serve the components of the computer 120. As illustrated in FIG. 1, the memory 126 is configured to store various data, including image data 132, quantized residual data 144, symbol-independent and symbol-dependent mixing CDF data 154 and 155, encoded data 156, and decoded RGB data 166.

Figure 2:
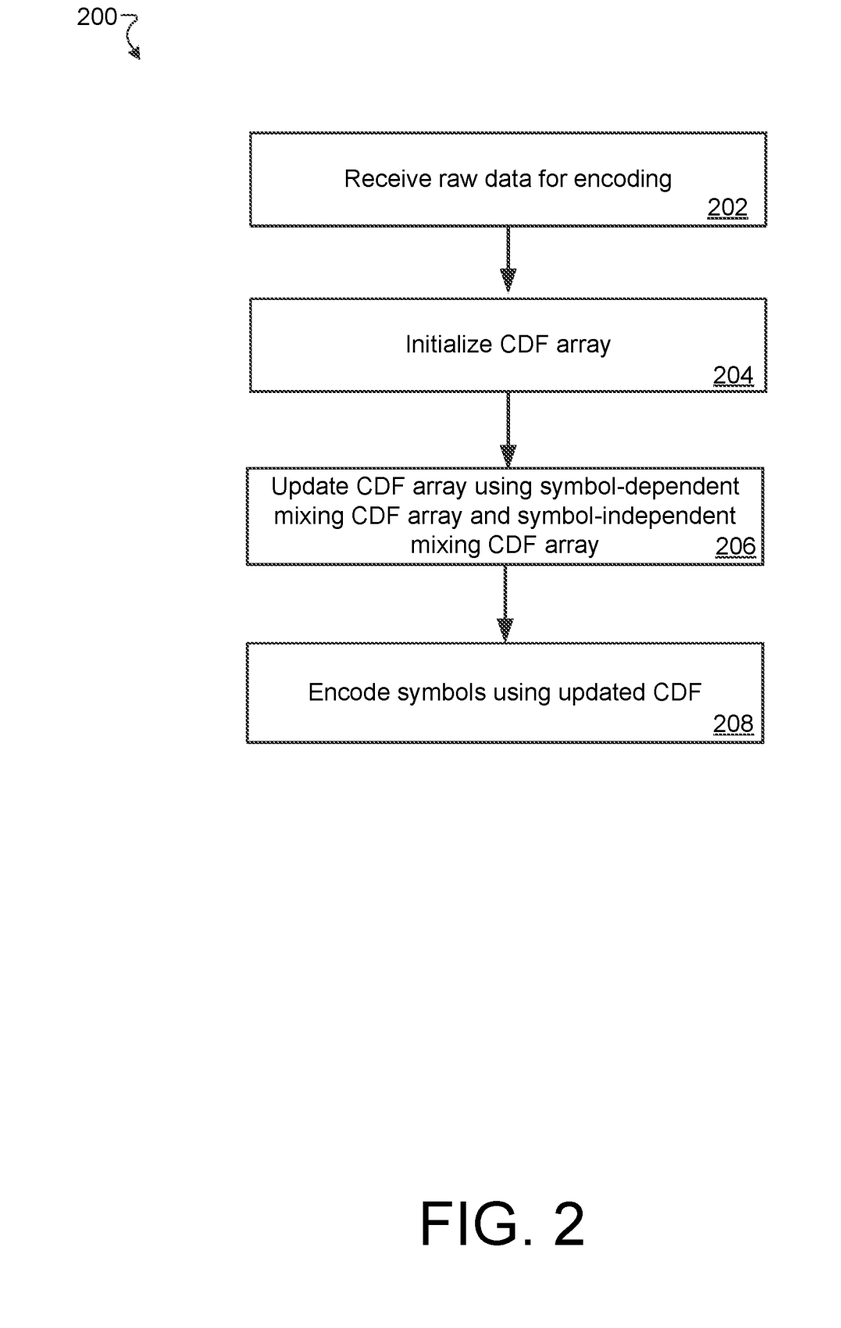
FIG. 2 is a flow chart that illustrates an example method of operating an augmented reality system, according to disclosed implementations.

FIG. 2 is a flow chart depicting an example method 200 of according to the above-described improved techniques. The method 200 may be performed by software constructs described in connection with FIG. 1, which reside in memory 126 of the computer 120 and are run by the set of processing units 124.

At 202, pre-compression manager 140 receive raw data for encoding, the raw data represented by an alphabet of symbols. For example, in some implementations the raw data is the quantized residual data 144 generated by the pre-compression manager 140 based on the image received by the image manager 130.

At 204, the arithmetic encoding manager 150 initializes a cumulative distribution function (CDF) array (e.g., CDF array data 153) representing a CDF evaluated at a plurality of indices, each of the plurality of indices representing a symbol of an alphabet representing a portion of the raw data, the CDF at an index of the plurality of indices representing a cumulative sum of probabilities of symbols of the alphabet represented by indices of the plurality of indices less than or equal to the index.

At 206, the arithmetic encoding manager 150, in response to receiving a first symbol of the alphabet, updates the CDF array based on a first mixing CDF array (e.g., symbol-independent mixing CDF data 154) and a second mixing CDF array (e.g., symbol-dependent mixing CDF data 155) to produce an updated CDF array, the first mixing CDF array having values that are independent of the first symbol, the second mixing CDF array having values based on the symbol. The updated CDF array may be used to determine a probability of a second symbol of the alphabet representing a second portion of the raw data.

At 208, the arithmetic encoding manager 150 encodes the first symbol and the second symbol using the updated CDF array to produce a codeword, the codeword, when decoded, reproducing the raw data.

Figure 3:
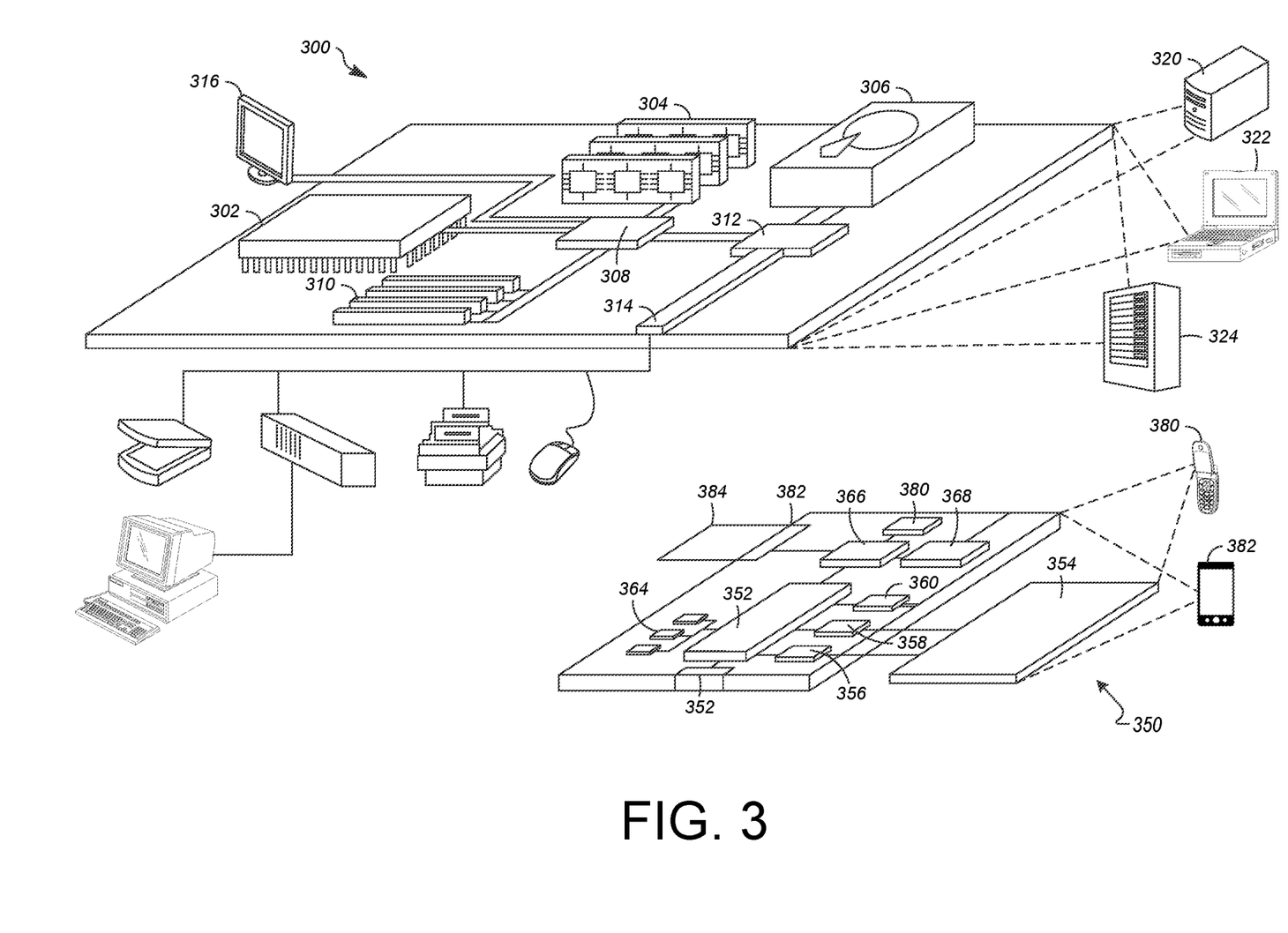
FIG. 3 is a diagram illustrating an example of a computer device and a mobile computer device that can be used to implement the described techniques.

FIG. 3 illustrates an example of a generic computer device 300 and a generic mobile computer device 350, which may be used with the techniques described here. Computer device 300 is one example configuration of computer 120 of FIG. 1

As shown in FIG. 3, computing device 300 is intended to represent various forms of digital computers, such as laptops, desktops, workstations, personal digital assistants, servers, blade servers, mainframes, and other appropriate computers. Computing device 350 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 300 includes a processor 302, memory 304, a storage device 306, a high-speed interface 308 connecting to memory 304 and high-speed expansion ports 310, and a low speed interface 312 connecting to low speed bus 314 and storage device 306. Each of the components 302, 304, 306, 308, 310, and 312, are interconnected using various busses, and may be mounted on a common motherboard or in other manners as appropriate. The processor 302 can process instructions for execution within the computing device 300, including instructions stored in the memory 304 or on the storage device 306 to display graphical information for a GUI on an external input/output device, such as display 316 coupled to high speed interface 308. In other implementations, multiple processors and/or multiple buses may be used, as appropriate, along with multiple memories and types of memory. Also, multiple computing devices 300 may be connected, with each device providing portions of the necessary operations (e.g., as a server bank, a group of blade servers, or a multi-processor system).

The memory 304 stores information within the computing device 300. In one implementation, the memory 304 is a volatile memory unit or units. In another implementation, the memory 304 is a non-volatile memory unit or units. The memory 304 may also be another form of computer-readable medium, such as a magnetic or optical disk.

The storage device 306 is capable of providing mass storage for the computing device 300. In one implementation, the storage device 306 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 304, the storage device 306, or memory on processor 302.

The high speed controller 308 manages bandwidth-intensive operations for the computing device 300, while the low speed controller 312 manages lower bandwidth-intensive operations. Such allocation of functions is exemplary only. In one implementation, the high-speed controller 308 is coupled to memory 304, display 316 (e.g., through a graphics processor or accelerator), and to high-speed expansion ports 310, which may accept various expansion cards (not shown). In the implementation, low-speed controller 312 is coupled to storage device 306 and low-speed expansion port 914. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 300 may be implemented in a number of different forms, as shown in the figure. For example, it may be implemented as a standard server 320, or multiple times in a group of such servers. It may also be implemented as part of a rack server system 324. In addition, it may be implemented in a personal computer such as a laptop computer 322. Alternatively, components from computing device 300 may be combined with other components in a mobile device (not shown), such as device 350. Each of such devices may contain one or more of computing device 300, 350, and an entire system may be made up of multiple computing devices 300, 350 communicating with each other.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of implementations have been described. Nevertheless, it will be understood that various modifications may be made without departing from the spirit and scope of the specification.

It will also be understood that when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A method, comprising:
receiving raw data for encoding, the raw data represented by an alphabet of symbols;
initializing a cumulative distribution function (CDF) array representing a CDF evaluated at a plurality of indices, each of the plurality of indices representing a symbol of the alphabet, wherein the symbol represents a portion of the raw data, the CDF at an index of the plurality of indices representing a cumulative sum of probabilities of symbols of the alphabet represented by indices of the plurality of indices less than or equal to the index;
in response to receiving a first symbol of the alphabet representing a first portion of the raw data, updating the CDF array based on a first mixing CDF array and a second mixing CDF array to produce an updated CDF array, the first mixing CDF array having values that are independent of the first symbol, the second mixing CDF array having values based on the first symbol, the updated CDF array being used to determine a probability of a second symbol of the alphabet representing a second portion of the raw data; and
encoding the first symbol and the second symbol using the updated CDF array to produce a codeword, the codeword, when decoded, indicating the first portion and the second portion of the raw data.

2. The method as in claim 1, wherein the second mixing CDF array has elements selected from a fixed array based on the symbol.

3. The method as in claim 2, wherein the fixed array includes a set of elements having indices less than a threshold index, each of the set of elements having a value of zero.

4. The method as in claim 2, wherein the fixed array includes a set of elements having indices greater than a threshold index, each of the set of elements being equal to a difference between a maximum probability and a number of symbols having a probability greater than zero.

5. The method as in claim 2, wherein the fixed array represents a sigmoidal function.

6. The method as in claim 1, wherein the first mixing CDF array has a plurality of elements, each of the plurality of elements having a value equal to a number of symbols of the alphabet being represented by an index less than the index of that element and having a probability greater than zero.

7. The method as in claim 1, wherein the first symbol is represented by a first index, and
wherein updating the CDF array includes:
generating a product of (i) a difference between (a) a sum of the first mixing CDF array at a second index based on the first index and the second mixing CDF array at the first index and (b) the CDF array at the first index, and (ii) a speed value, the speed value being between zero and unity and indicating a speed at which the CDF becomes fixed with regard to a new instance of the symbol in the encoding;
rounding the product to produce a rounded product; and
adding the rounded product to the CDF array at the first index.

8. The method as in claim 7, further comprising:
after updating the CDF array, changing the speed value to a new speed value.

9. The method as in claim 1, wherein the encoding of the raw data is an arithmetic coding producing, as encoded raw data, a numerical value; and
wherein the method further comprises:
performing a decoding operation on the numerical value to produce the raw data.

10. The method as in claim 1, wherein the raw data includes quantized residual data generated from image data representing an image.

11. A computer program product comprising a nontransitive storage medium, the computer program product including code that, when executed by processing circuitry of a computing device, causes the processing circuitry to perform a method, the method comprising:
receiving raw data for encoding, the raw data represented by an alphabet of symbols;
initializing a cumulative distribution function (CDF) array representing a CDF evaluated at a plurality of indices, each of the plurality of indices representing a symbol of the alphabet representing a portion of the raw data, the CDF at an index of the plurality of indices representing a cumulative sum of probabilities of symbols of the alphabet represented by indices of the plurality of indices less than or equal to the index;
in response to receiving a first symbol of the alphabet representing a first portion of the raw data, updating the CDF array based on a first mixing CDF array and a second mixing CDF array to produce an updated CDF array, the first mixing CDF array having values that are independent of the first symbol, the second mixing CDF array having values based on the first symbol, the updated CDF array being used to determine a probability of a second symbol of the alphabet representing a second portion of the raw data; and
encoding the first symbol and the second symbol using the updated CDF array to produce a codeword, the codeword, when decoded, indicating the first portion and the second portion of the raw data.

12. The computer program product as in claim 11, wherein the second mixing CDF array has elements selected from a fixed array based on the symbol.

13. The computer program product as in claim 12, wherein the fixed array includes a set of elements having indices less than a threshold index, each of the set of elements having a value of zero.

14. The computer program product as in claim 12, wherein the fixed array includes a set of elements having indices greater than a threshold index, each of the set of elements being equal to a difference between a maximum probability and a number of symbols having a probability greater than zero.

15. The computer program product as in claim 12, wherein the fixed array represents a sigmoidal function.

16. The computer program product as in claim 11, wherein the first mixing CDF array has a plurality of elements, each of the plurality of elements having a value equal to a number of symbols of the alphabet being represented by an index less than the index of that element and having a probability greater than zero.

17. The computer program product as in claim 11, wherein the first symbol is represented by a first index, and
wherein updating the CDF array includes:
generating a product of (i) a difference between (a) a sum of the first mixing CDF array at a second index based on the first index and the second mixing CDF array at the first index and (b) the CDF array at the first index, and (ii) a speed value, the speed value being between zero and unity and indicating a speed at which the CDF becomes fixed with regard to a new instance of the symbol in the encoding;

rounding the product to produce a rounded product; and adding the rounded product to the CDF array at the first index.

18. The computer program product as in claim 17, wherein the method further comprises:

after updating the CDF array, changing the speed value to a new speed value.

19. The computer program product as in claim 11, wherein the encoding of the raw data is an arithmetic coding producing, as encoded raw data, a numerical value; and wherein the method further comprises:

performing a decoding operation on the numerical value to produce the raw data.

20. An electronic apparatus, the electronic apparatus comprising:

memory; and controlling circuitry coupled to the memory, the controlling circuitry being configured to:

receive raw data for encoding, the raw data represented by an alphabet of symbols;

initialize a cumulative distribution function (CDF) array representing a CDF evaluated at a plurality of indices, each of the plurality of indices representing a symbol of the alphabet representing a portion of the raw data, the CDF at an index of the plurality of indices representing a cumulative sum of probabilities of symbols of the alphabet represented by indices of the plurality of indices less than or equal to the index;

in response to receiving a first symbol of the alphabet representing a first portion of the raw data, update the CDF array based on a first mixing CDF array and a second mixing CDF array to produce an updated CDF array, the first mixing CDF array having values that are independent of the first symbol, the second mixing CDF array having values based on the first symbol, the updated CDF array being used to determine a probability of a second symbol of the alphabet representing a second portion of the raw data; and encode the first symbol and the second symbol using the updated CDF array to produce a codeword, the codeword, when decoded, indicating the first portion and the second portion of the raw data.

21. An electronic apparatus, the electronic apparatus comprising:

memory; and controlling circuitry coupled to the memory, the controlling circuitry being configured to:

receive encoded raw data, wherein the encoded raw data is represented by a numerical value;

performing a decoding operation on the numerical value to produce the raw data, wherein the encoded raw data is produced through an arithmetic encoding process that includes:

receiving the raw data, the raw data being represented by an alphabet of symbols;

initializing a cumulative distribution function (CDF) array representing a CDF evaluated at a plurality of indices, each of the plurality of indices representing a symbol of the alphabet representing a portion of the raw data, the CDF at an index of the plurality of indices representing a cumulative sum of probabilities of symbols of the alphabet represented by indices of the plurality of indices less than or equal to the index;

in response to receiving a first symbol of the alphabet representing a first portion of the raw data, updating the CDF array based on a first mixing CDF array and a second mixing CDF array to produce an updated CDF array, the first mixing CDF array having values that are independent of the first symbol, the second mixing CDF array having values based on the first symbol, the updated CDF array being used to determine a probability of a second symbol of the alphabet representing a second portion of the raw data; and encoding the first symbol and the second symbol using the updated CDF array to produce a codeword.

* * * * *

UNITED STATES PATENT AND TRADEMARK OFFICE
CERTIFICATE OF CORRECTION

PATENT NO. : 12,149,265 B2
APPLICATION NO. : 17/904030
DATED : November 19, 2024
INVENTOR(S) : Massimino et al.

Page 1 of 1

It is certified that error appears in the above-identified patent and that said Letters Patent is hereby corrected as shown below:

On the Title Page

Column 2, item (57), under "ABSTRACT", Line 15, delete "symbol-dependent array." and insert -- symbol-independent array. --, therefor.

In the Claims

In Column 17, Claim 17, Lines 1-4, delete "(ii) a speed value, the speed value being between zero and unity and indicating a speed at which the CDF becomes fixed with regard to a new instance of the symbol in the encoding;" and insert the same on Column 16, Line 67, after "first index, and" as a continuation point.

In Column 18, Claim 21, Line 14, after "produce" delete "the".

Signed and Sealed this
First Day of April, 2025

Coke Morgan Stewart
*Acting Director of the United States Patent and Trademark Office*